United States Patent [19]

Kinoshita

[11] 4,223,396
[45] Sep. 16, 1980

[54] DELAYED LINE FOR SENSE AMPLIFIER PULSE

[75] Inventor: Hiroyuki Kinoshita, Tokyo, Japan

[73] Assignee: Tokyo Shibaura Denki Kabushiki Kaisha, Japan

[21] Appl. No.: 35,422

[22] Filed: May 2, 1979

[30] Foreign Application Priority Data

May 18, 1978 [JP] Japan .................................. 53-59085

[51] Int. Cl.² ............................................... G11C 7/00
[52] U.S. Cl. .............................. 365/194; 307/DIG. 3; 365/189
[58] Field of Search .............................. 365/189, 194; 307/DIG. 3, DIG. 5

[56] References Cited

U.S. PATENT DOCUMENTS

| | | | |
|---|---|---|---|
| 3,778,784 | 12/1973 | Karp et al. | 307/238 |
| 3,898,479 | 8/1975 | Proebsting | 307/205 |
| 3,902,082 | 8/1975 | Proebsting et al. | 307/279 |

FOREIGN PATENT DOCUMENTS

1193642  6/1970  United Kingdom .................. 365/194

Primary Examiner—Stuart N. Hecker
Attorney, Agent, or Firm—Finnegan, Henderson, Farabow, Garrett & Dunner

[57] ABSTRACT

A memory cell is connected to a word line and a data line. A first pulse is applied from an address decoder to the memory cell, and data read out from the memory cell is detected by a sense amplifier to which a second pulse is supplied. There is provided a pulse supply means for supplying the first and second pulses, which includes a delay line supplied with the first pulse and a pulse generator circuit composed of MOS transistors which receives as an input a delayed pulse from the delay line and delivers the second pulse. If the word line is formed of, for example, a polysilicon layer, then the delay line is also formed of a polysilicon layer so that the delay line may have substantially the same signal delay characteristic as that of the word line. Since the signal delay characteristics of the word and delay lines may vary correspondingly to each other in accordance with changes of device parameters, the phase difference between the first and second pulses can be adjusted for optimum results.

6 Claims, 21 Drawing Figures

DELAYED LINE FOR SENSE AMPLIFIER PULSE

BACKGROUND OF THE INVENTION

This invention relates to an integrated logic circuit, more specifically to an integrated logic circuit including a pulse generator means capable of reducing the influence of signal delay where wiring which inevitably delays signals exists in the integrated logic circuit.

In general, a dynamic memory system or synchronous static memory system has an integrated logic circuit including a memory cell array. When a word line of the memory cell array is activated, data stored in the memory cell is read out onto a data line. The read data is transmitted to a sense amplifier connected to the data line, and then detected and amplified. In operating the sense amplifier at a high speed without wrong operation, the phase difference between a word line driving pulse (first drive pulse) for activating the word line and a drive pulse (second drive pulse) for driving the sense amplifier is a question of vital interest. In other words, there exists, as a requisite for stable operation of the dynamic memory system, a requirement that the sense amplifier be supplied with the second drive pulse after the information read out from the memory cell is transferred to the sense amplifier by means of the data line. In order to fulfill such requirement, prior art systems have been employing a method as mentioned later. According to such method, however, the operating speed of the sense amplifier cannot be increased to a satisfactory degree, and the sense amplifier would cause malfunction if the supply voltage is raised for a speed-up. These defects have been pointed out as problems to be solved. This invention provides a new solution to such problems. In order to facilitate the understanding of this invention, there will now be described a prior art semiconductor memory system with reference to FIGS. 1 to 7.

Figure 1:
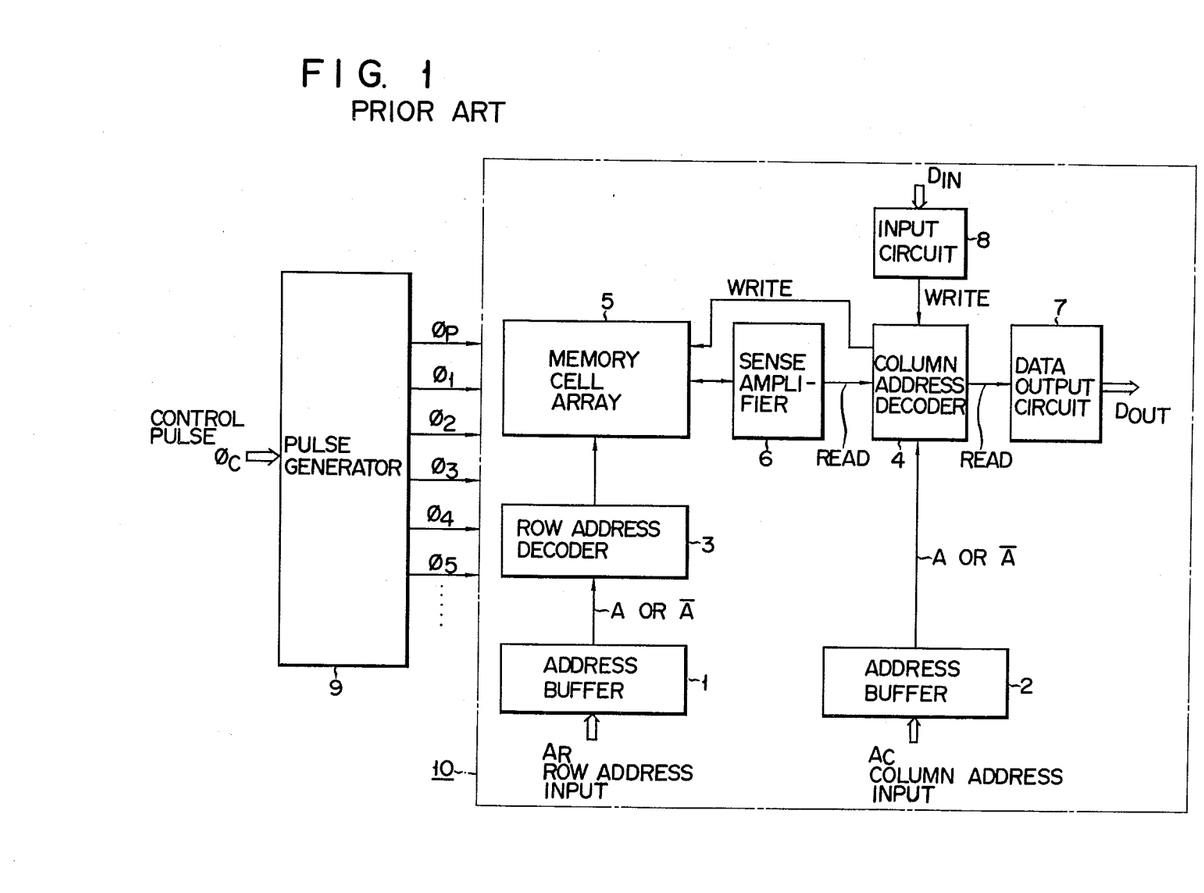
FIG. 1 is a block diagram showing an example of the configuration of a prior art system.

FIG. 1 is a block diagram showing a typical example of a conventional dynamic-type RAM (random access memory) system. In this drawing, numeral 10 designates a main body of the memory system including a memory cell array 5 and peripheral circuits coupled thereto. The body 10 is controlled by output pulses from a pulse generator 9. External row and column address signals $A_R$ and $A_C$ are amplified by a row address buffer circuit 1 and a column address buffer circuit 2 respectively. Outputs A or $\overline{A}$ of these buffer circuits select outputs of a row address decoder 3 and a column address decoder 4 respectively. In data reading, data stored in memory cells connected to a row of the memory cell array 5 which is designated by the output of the row address decoder 3 are amplified by a sense amplifier 6. Among the amplifier outputs, only the datum of a memory cell selected by the column address decoder 4 is delivered as an output Dout to the outside through a data output circuit 7. Data stored in those memory cells which belong to the selected row and nonselected columns are amplified by the sense amplifier 6, rewritten in their corresponding memory cells or refreshed. In writing data in the memory cell array 5, on the other hand, an input data Din is written through an input circuit 8 in a memory cell belonging to the designated row and column. The pulse generator 9, which receives a control pulse $\phi_c$ as an input, provides clock pulses, such as chip selection pulses, clock pulses for driving the address buffer circuits 1 and 2, decoders 3 and 4, sense amplifier 6, input circuit 8, and the output circuit 7. In FIG. 1, for example, the pulse generator 9 produces $\phi_p$ (precharge pulse) and $\phi_1$ to $\phi_5$, which are to be supplied to predetermined devices of the memory system body 10.

Figure 2:
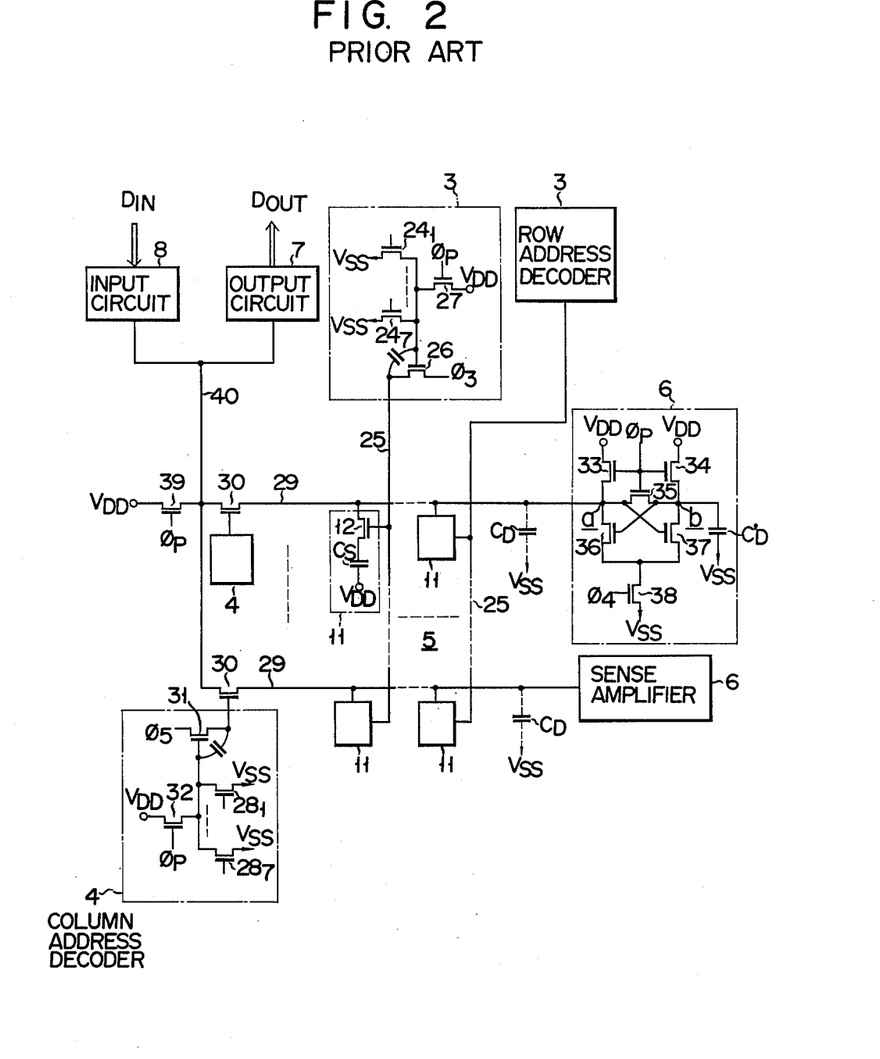
FIG. 2 is a detail drawing of a circuit corresponding to the diagram of FIG. 1.

FIG. 2 shows an example of a circuit diagram corresponding to the drawing of FIG. 1. In FIG. 2, the memory cell array is denoted by numeral 5, and a 1-transistor/cell-type memory cell consisting of an MOS transistor 12 and a capacitor $C_S$ for storing a single information is used for each of the memory cells 11. For each of the address buffer circuits 1 and 2 (FIG. 1), there is used such a circuit as disclosed in U.S. Pat. No. 3,902,082 and shown in the drawing of FIG. 3 hereof. In this circuit, $V_{DD}$ and $V_{SS}$ are first and second power sources respectively, and $\phi_p$ is a pulse for precharge. When the row address input $A_R$ or column address input $A_C$ is applied to the gate of an MOS transistor 17, a real address signal A and a supplementary address signal $\overline{A}$ are produced in synchronism with the clock pulse $\phi_2$. That is, nodes 15 and 16 in the states charged to a level "1" or $V_{DD}$ level, since MOS transistors 13 and 14 are turned on while the level of the precharge pulse $\phi_p$ is "1". When the level of the clock pulse $\phi_1$ becomes "1" while the address input $A_R$ or $A_C$ is at "1", MOS transistors 17 and 18 are turned on, so that only the charges on the node 15 are discharged. When, in this state, the clock pulse $\phi_2$ gets the level "1", MOS transistors 19 and 20 are turned on, while MOS transistors 21 and 22 are turned off, so that the real and supplementary address signals A and $\overline{A}$ become "1" and "0" respectively. While the address input $A_R$ or $A_C$ is at "0", on the other hand, the MOS transistor 17 is off, so that the nodes 15 and 16 maintain the level "1". When the level of the clock pulse $\phi_2$ then becomes "1", A at a relatively high voltage and $\overline{A}$ at a relatively low voltage appear at the output although the transistors 19 to 22 are all on. The reason for this is that the conductance of the MOS transistor 21 is set to be larger than that of the MOS transistor 20 and that the conductance of the MOS transistor 19 is set to be smaller than that of the MOS transistor 22. When the voltage of A exceeds threshold voltage Vth of an MOS transistor 23, the MOS transistor 23 is turned on, and the MOS transistors 19 and 20 are turned off, thereby reducing A definitely to the level "0". Meanwhile, the potential of $\overline{A}$ gradually increases to the level "1". Where the memory array 5 is so constructed as to have a capacity of 16 K bits, the sum of the numbers of the row address buffer circuits 1 and the column address buffer circuits 2 may be 14, for example.

The row address decoder 3 as shown in FIG. 2 is connected to, for example, one end of each corresponding word line 25. In this decoder 3, seven outputs A or $\overline{A}$ of the row address buffer circuit 1 (FIG. 3) are supplied respectively to the gates of MOS transistors $24_1$ to $24_7$, which are connected in parallel with the gate of an MOS transistor 26 coupled to the one end of the word line 25. Further, the gate of the transistor 26 is connected with an MOS transistor 27 for precharging such gate, while the gate of the transistor 27 is supplied with the precharge pulse $\phi_p$.

Figure 3:
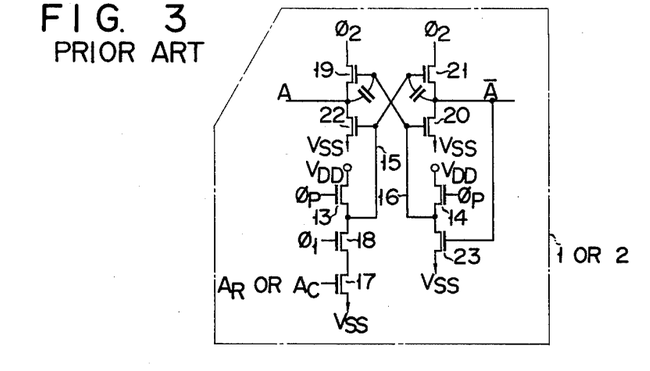
FIG. 3 is a detail drawing showing an example of an address buffer circuit as shown in FIG. 1.

The column address decoder 4 as shown in FIG. 2 is connected to the gate of each data line selection MOS transistor 30 which is connected to, for example, one end of each corresponding data line 29. The address decoder 4 includes MOS transistors $28_1$ to $28_7$ with the drains connected in common and the sources coupled to the second power source $V_{SS}$, an MOS transistor 32 with the source connected to the common drains and the drain coupled to the first power source $V_{DD}$, and a drive transistor 31 with the source connected to the gate of the transistor 30 and the drain supplied with the clock pulse $\phi_5$. The gates of the transistors $28_1$ to $28_7$ are supplied respectively with the outputs A or $\overline{A}$ of the seven column address buffer circuits 2 as shown in FIG. 3. Whereas the drain of the transistor 26 of the row address decoder 3 is supplied with the drive pulse $\phi_3$ of the word line 25, the clock pulse $\phi_5$ is applied to the drain of the transistor 31 of the column address decoder 4.

The sense amplifier 6 as shown in FIG. 2 is disclosed in the specification of U.S. Pat. No. 3,774,176. The amplifier 6 is a circuit to detect and amplify fine changes of voltage on the data line 29 that is supplied to a node a. That is, the voltage read out onto the data line 29 correspondingly to the stored data "0" or "1" in the memory cell 11 is amplified by properly selecting the ratio of a capacitance of a stray capacitor $C_D$ of the data line 29 to that of a capacitor $C_D'$ of the sense amplifier 6. More specifically, MOS transistors 33 and 34 which receive the precharge pulse $\phi_p$ as the gate input charge the capacitors $C_D$ and $C_D'$, while an MOS transistor 35 which also receives the precharge pulse $\phi_p$ as the gate input maintains output ends a and b at the same potential. MOS transistors 36 and 37 constitute a flip-flop. If one of the memory cells 11 in which the stored data in the capacitor $C_S$ is "0" is selected and the MOS transistor 12 is turned on, the voltage of the capacitor $C_D$ drops a bit. At this point of time, when the drive pulse $\phi_4$ of the sense amplifier 6 is supplied to the gate of a transistor 38 to turn on the transistor 38, the potential at the output point a of the sense amplifier 6 drops to the level "0". On the other hand, if a memory cell 11 in which the stored data in the capacitor $C_S$ is "1" is selected, then the potential at the output point a of the sense amplifier 6 is maintained at the level "1". This is done because the capacitors $C_D$ and $C_D'$ are so set that the discharge of the capacitor $C_D'$ may be finished ahead of the discharge of the capacitor $C_D$.

An MOS transistor 39 as shown in FIG. 2, which receive the precharge pulse $\phi_p$ as the gate input, tends to precharge an input-output line 40.

Figure 4:
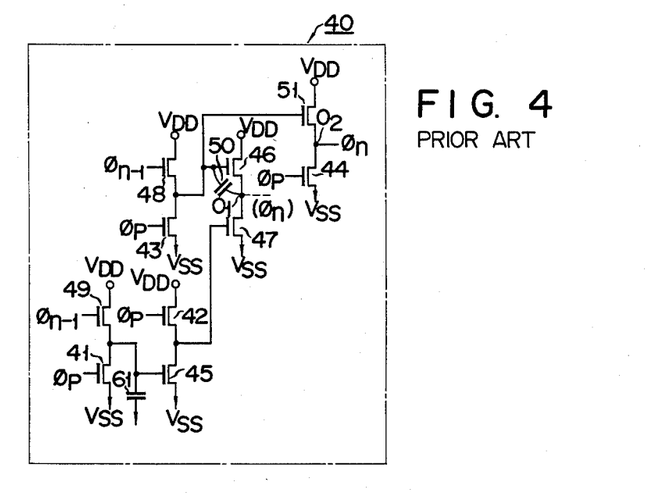
FIG. 4 is a detail drawing of a pulse generator circuit included in a pulse generator as shown in FIG. 1.

FIG. 4 shows a clock pulse generator circuit 40 built in the pulse generator 9 as shown in FIG. 1. This circuit 40 is a delay circuit composed of MOS transistors which is disclosed in the specification of U.S. Pat. No. 3,898,479. In the circuit 40, a clock pulse $\phi_{n-1}$ (n=1,2,..., 5) is applied to the gates of MOS transistors 49 and 48 to provide an output pulse $\phi_n$ after a fixed time. By cascade connecting five such circuits 40 and applying the control pulse $\phi_c$ (FIG. 1) to a first-stage input gate, the internal clock pulses $\phi_1$ to $\phi_5$ of the memory system are obtained as outputs of the first to fifth circuits 40, respectively. As for the aforementioned generator circuit for the precharge pulse $\phi_p$, which produces the precharge pulse $\phi_p$ by means of the control pulse $\phi_c$, it will later be described in detail. In the circuit 40 of FIG. 4, MOS transistors 41 to 44 are on, MOS transistors 45 and 46 are off, and an MOS transistor 47 is on while the level of the precharge pulse $\phi_p$ is "1". When the levels of the pulses $\phi_p$ and $\phi_{n-1}$ become "0" and "1" respectively, an MOS transistor 48 is turned on to charge a capacitor 50, and then the transistor 46 is turned on. Since conductance gm of the transistor 49 is set smaller than that of the transistor 48, the transistor 45 is turned on with a time lag from a point of time when the transistor 46 is turned on, and then the transistor 47 is turned off. Before the transistor 47 is turned off, an output end $O_1$ is at a potential determined by the conductance ratio between the transistors 46 and 47. When the transistor 47 is turned off, however, the output end $O_1$ is charged with the first supply voltage $V_{DD}$, so that the gate potential of the transistor 46 is pulled up under the influence of the capacitor 50 to a level above the supply voltage $V_{DD}$. Accordingly, the transistors 46 and 51 operate in a triode region, and the output at an output end $O_2$ attains the level "1" corresponding to the voltage $V_{DD}$. The "1"-level output serves as an input for the next-state circuit 40. When the precharge clock pulse $\phi_p$ resumes the level "1", $100_n$ (n=1,2..., 5) is reduced to the level "0". Although the clock pulse $\phi_n$ used in FIG. 4 is usually produced from the output end $O_2$ at the junction of the transistors 44 and 51, it may alternatively be one which is generated from the output end $O_1$ at the junction of the transistors 46 and 47.

Figure 5:
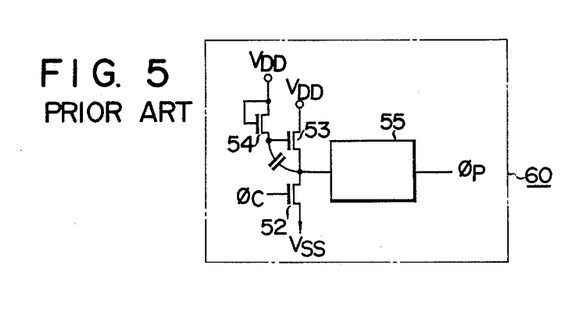
FIG. 5 is a block diagram of a precharge pulse generator included in the pulse generator as shown in FIG. 1.

An example of the generator circuit for the precharge pulse $\phi_p$, which is contained in the pulse generator 9 (FIG. 1), is shown in FIG. 5 and denoted by numeral 60. Namely, a delay circuit 55 is connected to the output end of an inverter formed of an MOS transistor 52 to receive the external control pulse $\phi_c$ as its gate input and load MOS transistors 53 and 54, and thus the output of the delay circuit 55 is taken out as the precharge pulse $\phi_p$. The delay circuit 55 is illustrated in detail within a chain line in FIG. 6. In the circuit 55, the output of the inverter is supplied to the gates of the transistors 48 and 49 of the circuit 40 of FIG. 4, $\phi_c$ is supplied to the gates of the transistors 41, 42, 43 and 44, and $\phi_p$ is taken out from the output end $O_2$. Therefore, elements in FIG. 6 corresponding to the elements in FIG. 4 are denoted by like reference numerals but with primes, and detailed description of such elements is omitted. The circuit 55 of FIG. 5 is not limited to the precise circuit arrangements shown in FIG. 6.

Figure 7A:
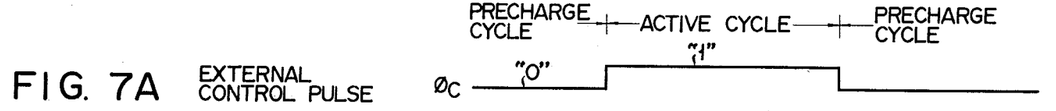
FIG. 7 including 7A–7L, is a timing chart illustrating drive pulses for the system as shown in FIGS. 1 and 2.
Figure 7B:
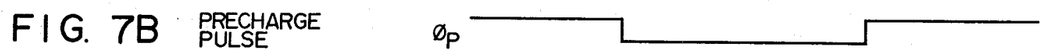
Figure 7C:
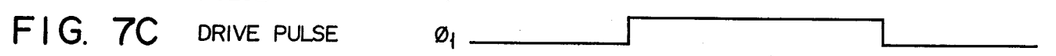
Figure 7D:
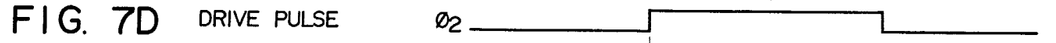
Figures 7E, 7F:
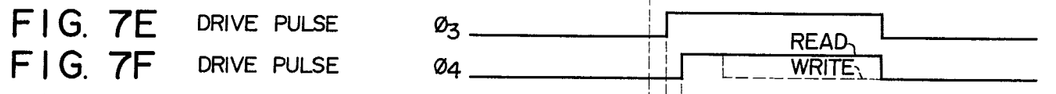
Figure 7G:
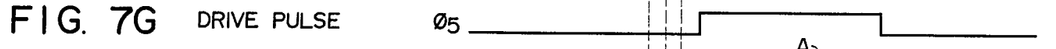
Figure 7H:
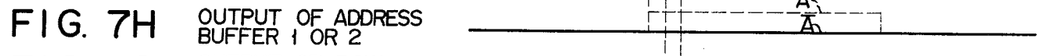
Figure 7I:
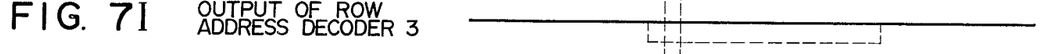
Figure 7J:
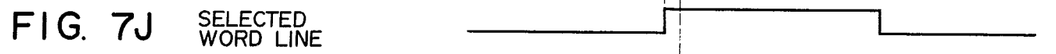
Figure 7K:
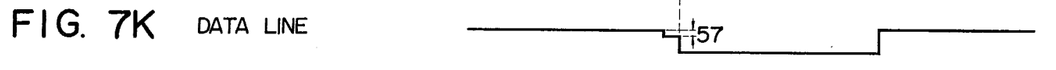
Figure 7L:
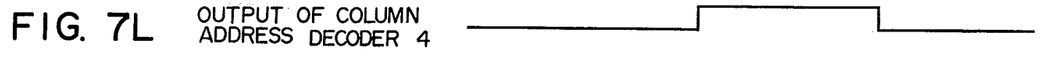

FIGS. 7A to 7L are timing charts for illustrating the operations of the circuits as shown in FIGS. 1 and 2. When the level of the external control pulse $\phi_c$ (FIG. 7A) becomes "1" (active cycle), the precharge pulse $\phi_p$ (FIG. 7B) is reduced to the level "0" with a short time delay, and then the internal clock pulses $\phi_1$ to $\phi_5$ are produced one after another following the precharge pulse (FIGS. 7C to 7G). The address output A or $\overline{A}$ is delivered in synchronism with the clock pulse $\phi_2$ (FIG. 7H, FIG. 3). The decoders 3 and 4, which have been charged to the level "1" by the precharge pulse, are all discharged to the level "0", excepting ones for a selected row and a selected column. When the level of the drive pulse $\phi_3$ for the word lines 25 becomes "1" (FIG. 7E), only a word line 25 for the selected row gets the level "1", the other word lines 25 for the nonselected rows remaining "0". When the data stored in the capacitor $C_S$ of a memory cell belonging to the selected word line 25 is at "0", for example, the charges on the capacitor $C_D$ are distributed according to the ratio between the capacitor $C_S$ of the memory cell and the capacity $C_D$ of the data line 29 (here $C_D>>C_S$), so that the voltage at the output end a of the sense amplifier 6 is slightly reduced (57 in FIG. 7K). When the level of the drive pulse $\phi_4$ for the sense amplifier 6 becomes "1" (FIG. 7E) after the data of the cell 11 is fully transferred to the output point a, that is, after the fine voltage at the output point a is produced, the sense amplifier 6 is driven to discharge the data line 29 to the level "0" (FIG. 7K). Subsequently, when the clock pulse $\phi_5$ is supplied to the column address decoder 4, only the data of the data line 29 belonging to the selected column (FIG. 7L) is read out to the outside through the input-output line 40 and the output circuit 7. In writing data in the cell, input data is written in the selected cell through the input circuit 8, input-output line 40 and data line 29. At time of such data writing, the level of the drive pulse $\phi_4$ for the sense amplifier 6 is returned to "0" (FIG. 7F), so that there will be created no DC path between the first and second power sources $V_{DD}$ and $V_{SS}$ through the sense amplifier 6. When the level of the external control pulse $\phi_c$ becomes "0" (FIG. 7A), the precharge pulse $\phi_p$ attains the level "1" (FIG. 7B), and the output pulses $\phi_1$ to $\phi_5$ of the pulse generator 9 and the outputs of the address buffer circuits 1 and 2 return to the standby state or level "0". At the same time, the data line 29, input-output line 40 and address decoders 3 and 4 are charged to the level "1" for a subsequent active cycle.

It has already been mentioned, as a condition for stable or proper operation of the above-described dynamic memory system, that the pulse $\phi_4$ must be supplied after the information read out from the memory cell 11 is transferred to the output point a of the sense amplifier 6 by means of the data line 29. For the fulfillment of such requirement, the signal delay on the word line 25 or data line 29 is matter of importance, since transmitted signals will inevitably be delayed on the word or data line 25 or 29. Now there will be described examples of such signal delay.

In manufacturing a semiconductor memory, the silicon gate process is usually employed. According to this process, the word line 25 and the data line 29 of the memory cell array 5 are required to cross at right angles. To attain this, there may be given two methods to be employed. In a first method, the word and data lines 25 and 29 are formed of aluminum wiring and a diffusion layer respectively. In a second method, on the other hand, the word and data lines 25 and 29 are formed of a polysilicon layer and aluminum wiring respectively. However, the layer resistances of the diffusion layer and polysilicon layer are large; approximately 10 to 50 $\Omega/\Box$ for the former and 30 to 100 $\Omega/\Box$ for the latter when manufacturing an N-channel MOS memory array, for example. In a large-capacity memory with a number of memory cells 11 connected to the word and data lines 25 and 29, the stray capacity and resistance of the word or data line are large, so that the delay times of signals or data transmitted by means of such lines are naturally long. In forming a 16K-bit RAM, for example, each of the word and data lines is connected with 128 memory cells (64 memory cells connected to each side of each data line, when using a balanced sense amplifier), so that the total resistance of each data line is approximatey 4 to 15 k$\Omega$ and the stray capacity ranges from 1 to 2 pF where the data line 25 is formed of the diffusion layer. Accordingly, the time constant required for the data propagation of the data line is about 4 to 30 nsec. If the memory cell 11 farthest from the sense amplifier 6 is selected, the time required for the data read out from such cell to reach the output end a of the sense amplifier by means of the data line 29 will be prolonged. If the word line 25 is formed of the polysilicon layer, then the capacity of load connected to the word line and the layer resistance of the word line are increased as compared with the data line, so that additionally long time would be required to activate the word line. In consequence, more time is required for the data of the cell 11 to reach the output point a of the sense amplifier after the pulse $\phi_3$ is applied to the decoder 3.

When using the silicon gate process, as described above, the pulse generator 9 must be designed with allowance for a time interval between the drive pulse $\phi_3$ for the word line 25 and the drive pulse $\phi_4$ for the sense amplifier 6, in consideration of the signal delay time on the word line 25 or data line 29 besides the delay time required for the operation of the MOS transistor 12 of the memory cell 11. Generally, the delay time of the output $\phi_n$ compared with the input $\phi_{n-1}$ of the circuit 40 as shown in FIG. 4 may be adjusted by changing the conductance gm of the transistor 49 or the capacitance of a capacitor 61. In the prior art system, therefore, such conductance or capacitance has been adjusted taking account of the sum of the delay time required for the transfer transistor 12 of the memory cell 11 and the signal delay time on the word or data line 25 or 29. Since the transfer transistor 12 has the same construction with the transistors of the clock pulse generator circuit 40 (FIG. 4), the delay time required for the operation thereof may be automatically adjusted if the supply voltage $V_{DD}$ or device parameters (e.g., gate oxide film, channel length, etc.) are changed. Thus, the time interval between the pulses $\phi_3$ and $\phi_4$ may be determined by the conventional method without involving any substantial trouble. Caused without regard to the operations of the transistors, however, the signal delay time on the word or data line 25 or 29 is subject to the influences of the variations in the device parameters and supply voltage. In order to avoid such influences, the delay time of the pulse $\phi_4$ compared with the pulse $\phi_3$ has conventionally been determined as follows. That is, supposing that the layer resistance of the diffusion layer (data line) or polysilicon layer (word line) is within a fixed range, the phase difference between the pulses $\phi_3$ and $\phi_4$ has been so determined by the prior art method (adjustment of the conductance of the transistor 49 and the capacitance of the capacitor 61 as shown in FIG. 4) as to secure stable operation of the sense amplifier 6, even if the layer resistance takes its upper limit value or the signal delay time on the word or data line is maximized, and if the supply voltage $V_{DD}$ is maximized within its allowable range or the time interval between the clock pulses $\phi_3$ and $\phi_4$ is minimized.

It has been found, however, that the aforesaid prior art method is subject to some defects as follows:

(1) Since there exist fluctuations and variations in the supply voltage and device parameters (e.g., gate oxide film, channel length, etc.), it is necessary to make allowance for the data propagation delay time on the word line 25 or data line 29 to operate sense amplifier 6 without malfunction. By doing this, the operating speed of the sense amplifier 6 or the memory system may be reduced.

(2) When the layer resistance of the polysilicon layer, for example, for the word line 25 or the diffusion layer, for example, for the data line 29 is large and the supply voltage is increased, wrong operation of the sense amplifier 6 will be caused if the anticipated propagation delay time as mentioned in item (1) cannot compensate for the increase of the layer resistance.

(3) When the layer resistance is small and the supply voltage is lowered, in contrast with the case of item (2), the propagation delay time as mentioned in item (1) is given too much allowance, so that the operating speed of the sense amplifier 6 is reduced.

Accordingly, the object of this invention is to provide an integrated logic circuit including a logic circuit, an output selection circuit for the logic circuit and a sense amplifier circuit to detect selected output, in which the integrated logic circuit further includes a pulse generator circuit capable of preventing wrong operation of the sense amplifier circuit and increasing the operating speed in spite of variations in parameters of devices constituting the integrated circuit as well as fluctuations in supply voltage for the integrated circuit.

SUMMARY OF THE INVENTION

The integrated circuit of this invention comprises a logic circuit, an output selection circuit coupled to the logic circuit for obtaining a desired output from the logic circuit, a detector for detecting the output of the logic circuit, and a pulse supply means for supplying first and second drive pulses at least to the output selection circuit and the detector respectively; the pulse supply means including a delay line receiving the first drive pulse as an input and a pulse generator composed of MOS transistors which receives as an input a delayed pulse from the delay line and delivers the second drive pulse, the delay line exhibiting a signal delay characteristic substantially equivalent to that of a signal transmission line provided between the selection circuit and the detector.

According to an embodiment of the invention, there is provided an integrated circuit which comprises a plurality of word lines formed of polysilicon layers, a plurality of data lines formed of aluminum layers, a plurality of memory cells coupled to the word and data lines at the intersecting points thereof, a plurality of address decoders coupled to the respective word lines and supplying first drive pulse to the memory cells coupled to the word lines, a plurality of sense amplifiers coupled to the respective data lines and detecting signals read out from the memory cells coupled to the data lines when the second drive pulse is supplied, and a pulse supply means for supplying first and second drive pulses at least to the address decoders and the sense amplifiers respectively. The pulse supply means includes a delay line formed of a polysilicon layer which receives the first drive pulse as an input and a pulse generator circuit composed of MOS transistors which receives as an input a delayed pulse from the delay line and delivers the second drive pulse, the delay line exhibiting a signal delay characteristic substantially equivalent to that of the word lines.

According to the above-mentioned embodiment of the invention, an address decoder is connected with a memory cell by means of a word line formed of a polysilicon layer, while the memory cell is connected with a sense amplifier by means of a data line formed of an aluminum layer. The signal delay between the address decoder and sense amplifier, therefore, depends on the signal delay on the word line. Hereupon, the delay line in the pulse generator means of the invention is so formed as to have the signal delay characteristic substantially equivalent to that of the word line. By way of example, the cross-sectional area and overall length of the delay line are substantially equal to those of the word line, and a capacity belonging to the delay line is substantially as large as a capacity attached to the word line. Accordingly, if the signal delay time on the word line is changed due to variations in parameters of devices constituting the integrated circuit, the signal delay time on the delay line in the pulse generator means will also vary in accordance with such changes of the signal delay time on the word line. Thus, it will be very easy to supply the second drive pulse to the sense amplifier after the signal from the memory cell has reached the sense amplifier, eliminating the aforementioned defects of the prior art system.

DETAILED DESCRIPTION OF THE PREFERRED EMBODIMENT

Figure 8:
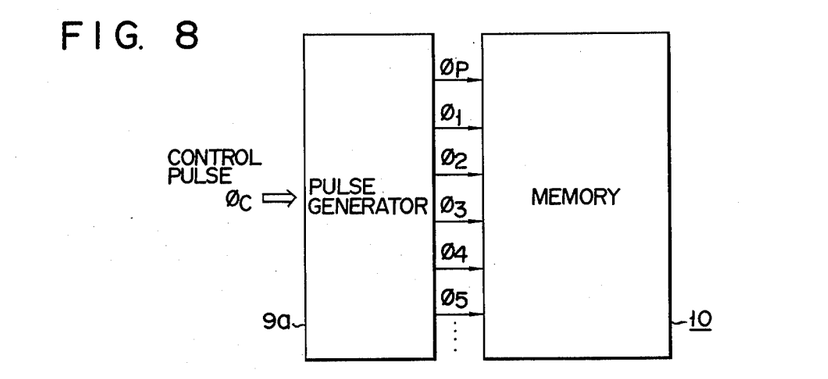
FIG. 8 is a block diagram showing an embodiment of this invention.

In FIG. 8, a circuit designated by numeral 10 is the same as the circuit 10 of FIG. 1, so that it will not further be described here to avoid repetition. Like the circuit 9 of FIG. 1, a circuit 9a as shown in FIG. 8 is supplied with the external control pulse $\phi_c$ as an input and delivers the precharge pulse $\phi_p$, drive pulses $\phi_1$ to $\phi_5$, etc., although the circuit 9a differs from the circuit 9 in the internal circuit arrangement. Therefore, only the pulse generator 9a will be described hereinafter.

Figure 6:
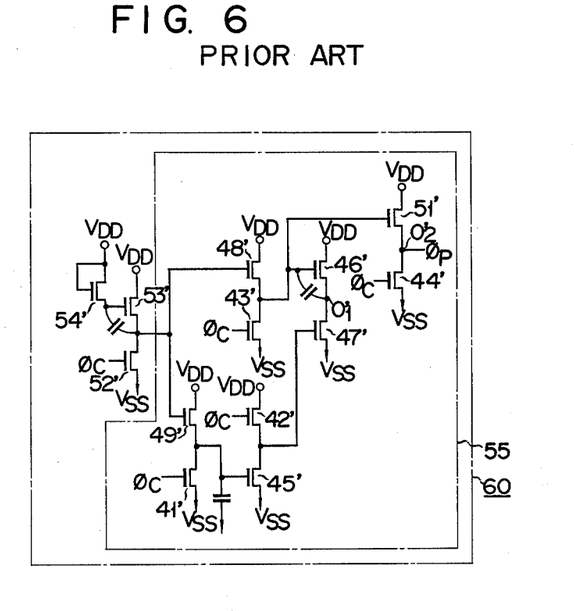
FIG. 6 is a detail drawing of the precharge pulse generator of FIG. 5.
Figure 9:
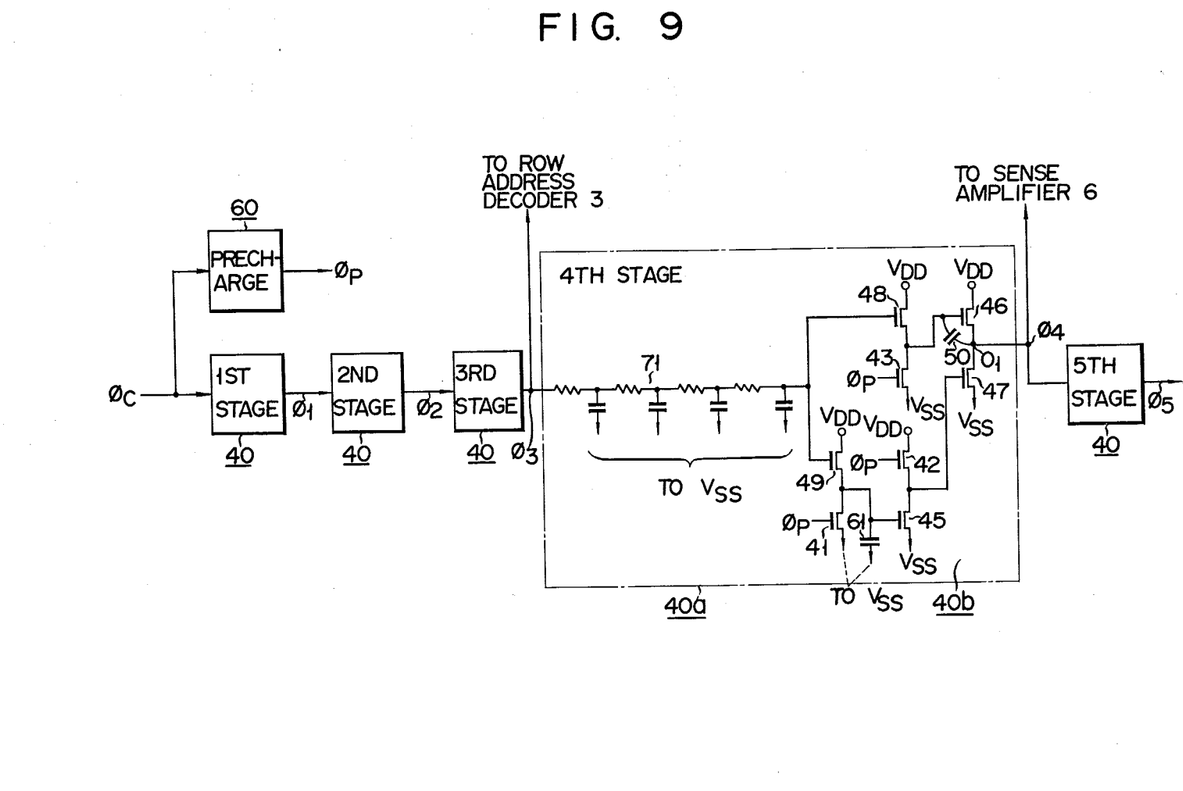
FIG. 9 is a block diagram showing an example of a pulse generator means as shown in FIG. 8, including a partial detail circuit diagram.

Referring now to FIG. 9, the external control pulse $\phi_c$ is supplied to the precharge pulse generator 60 as shown in FIG. 6, from which the precharge pulse $\phi_p$ may be obtained as already mentioned. The drive pulse $\phi_1$ is obtained from a first-stage pulse generator circuit 40 as shown in FIG. 4 by supplying the external control pulse $\phi_c$ to the gates of the transistors 48 and 49 of the first-stage circuit 40. Likewise, the drive pulse $\phi_2$ is obtained by supplying the drive pulse $\phi_1$ to the gates of the transistors 48 and 49 of a second-stage pulse generator circuit 40, and the drive pulse $\phi_3$ is obtained by supplying the drive pulse $\phi_2$ to the gates of the transistors 48 and 49 of a third-stage pulse generator circuit 40. A fourth-stage pulse generator circuit 40a is formed of a delay line 71 and pulse generator circuit 40b. The drive pulse $\phi_3$ (or first drive pulse) is applied to the delay line 71, and the delayed pulse is supplied to the gates of the transistors 48 and 49 of the circuit 40b. Although having the same configuration of the circuit 40, the circuit 40b is so constructed that the output $\phi_n$ ($\phi_4$ for this embodiment) is taken out from the junction of the transistors 46 and 47, so that the transistors 44 and 51 are omitted in FIG. 9. The output $\phi_4$ (or second drive pulse) of the pulse generator circuit 40b is supplied to the gates of the transistors 48 and 49 of a fifth-stage pulse generator circuit 40 (FIG. 4), and the drive pulse $\phi_5$ is taken out from the fifth-stage circuit. As for the pulses $\phi_p$ and $\phi_1$ to $\phi_5$ that are supplied to the memory 10, they have already been described with reference to FIGS. 2 and 7. Omitting detailed description of such pulses and referring to FIG. 2, therefore, there will now be explained only how the drive pulses $\phi_3$ (first pulse) and $\phi_4$ (second pulse) are supplied.

Hereupon, let us suppose a case where the word lines 25 (FIG. 2) and the data lines 29 are formed of polysilicon and aluminum layers respectively. In this case, the delay line 71 is formed in the LSI (large-scale integrated) circuit under the same forming conditions for the word lines 25. For example, the delay line 71 may be so formed as to have substantially the same cross section and overall length as those of the word lines 25 and that a capacity belonging to the delay line 71 may be formed substantially as large as a capacity attached to a word line 25. Even though the word line 25 is rectilinear, the delay line 71 may be bent but with the same length. Moreover, it is to be understood that the delay line 71 may be so designed as to provide a little longer signal delay time, as well as greater length and load capacity, as compared with the word line 25.

By providing the aforesaid delay line 71, the drive pulse $\phi_3$ for the word lines 25 (FIG. 2) is supplied to the transistors 48 and 49 of the pulse generator 40b at the same time when the pulse $\phi_3$ is propagated to the farthest memory cell 11 from the decoder 3, thereby producing the sense amplifier driving pulse $\phi_4$. Accordingly, the time interval between the pulses $\phi_3$ and $\phi_4$ is equal to the sum of the time interval between the input and output pulses of the pulse generator 40b itself and the signal delay time on the word line 25. The signal delay time at the pulse generator 40b itself needs only to be coincident with the response time of the data transfer transistor 12 of the memory cell 11, and the change of the signal delay time on the word line 25 may be automatically adjusted by the delay line 71 itself. Namely, if the layer resistance, etc. of the word line (formed of a polysilicon layer) changes with variations of device parameters to vary the signal delay time on the word line 25, the delay time of the delay line 71 will also vary in accordance with such variation. Accordingly, the phase difference between the pulses $\phi_3$ and $\phi_4$ is automatically adjusted so that the sense amplifier 6 may operate under the optimum conditions. It will be seen from the above description that the aforementioned defects (items (1), (2) and (3)) of the prior art system, which have been requiring remedies, may be eliminated according to this invention.

Now let us suppose a case where the word and data lines 25 and 29 are formed of aluminum and diffusion layers respectively. Since, in this case, the signal delay time on the word line 25 becomes substantially zero because the resistance of the aluminum line is very small, so that consideration needs to be given only to the signal delay time on the data line 29. That is, in this case, it is necessary only that the delay line 71 be formed of the same diffusion layer of the data line 29 so that the delay characteristic of the delay line 71 may be substantially the same as that of the data line 29.

Figure 10:
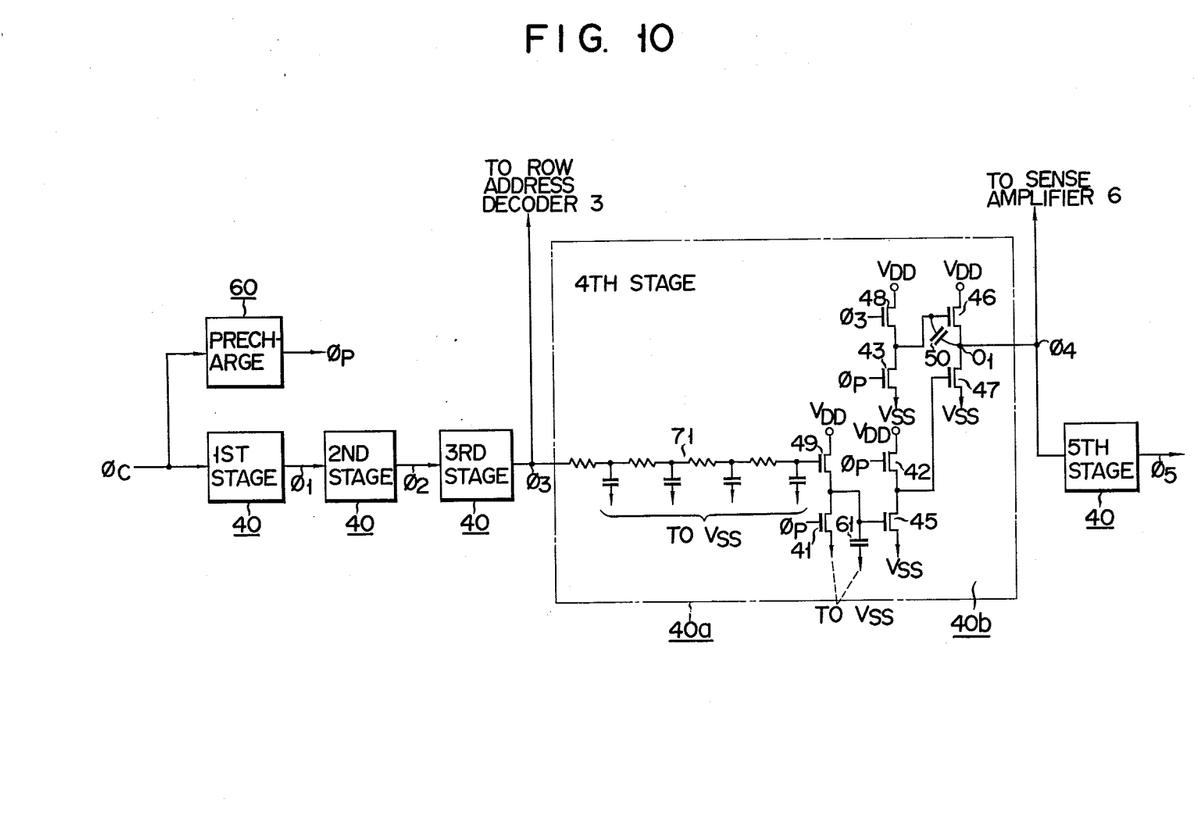
FIG. 10 is a block diagram showing another example of the pulse generator means of FIG. 8, including a partial detail circuit diagram.

FIG. 10 shows another example of the pulse generator means, in which the delayed pulse from the delay line 71 is supplied only to the gate of the transistor 49 of the pulse generator circuit 40b. This arouses no special problem because the delay time of the output pulse $\phi_4$ at the pulse generator 40a as compared with the input pulse $\phi_3$ is determined on the side including the transistors 49 and 41 and the capacitor 61.

Although in the above embodiments the logic circuit is described as a dynamic memory cell array, this invention may be applied also to such a memory system that a memory cell array operates statically and peripheral circuits connected to the array operate in synchronism with the external control pulse $\phi_c$. Moreover, the logic circuit is not limited to the memory cell array, but may be applied also to a circuit which, having a relatively long wiring formed of a diffusion layer or polysilicon layer, operates when supplied with first and second pulses between which a phase difference needs to exist, and such that the phase difference between the pulses must be adjusted by the signal delay time of the wiring. Although the embodiments as shown in FIGS. 9 and 10 are explained, to facilitate the understanding of the invention, as such that the pulses $\phi_p$, $\phi_1$, $\phi_2$ and $\phi_5$, besides the first and second pulses $\phi_3$ and $\phi_4$, may be produced from the pulse generator means, the pulses are not limited to that precise number. Furthermore, the arrangements of the pulse generator circuit formed of the MOS tansistors are not limited to those illustrated.

What is claimed is:

1. An integrated logic circuit comprising a logic circuit, an output selection circuit coupled to said logic circuit for selecting a desired output from said logic circuit, a detector for detecting said selected output of said logic circuit, and a pulse supply means for supplying first and second drive pulses at least to said output selection circuit and said detector respectively; said pulse supply means including a delay line receiving said first drive pulse as an input and a pulse generator composed of MOS transistors which receives as an input a delayed pulse from said delay line and delivers said second drive pulse, said delay line exhibiting a signal delay characteristic substantially equivalent to that of a signal transmission line provided between said selection circuit and said detector.

2. An integrated logic circuit comprising a plurality of word lines, a plurality of data lines, a plurality of memory cells coupled to said word and data lines at the intersecting points thereof, a plurality of address decoders coupled to said respective word lines and applying a first drive pulse to said memory cells coupled to said word lines, a plurality of sense amplifiers coupled to said respective data lines and detecting signals read out from said memory cells coupled to said data lines when a second drive pulse is supplied, and a pulse supply means for supplying said first and second drive pulses at least to said plurality of address decoders and said sense amplifiers respectively; said pulse supply means including a delay line which (1) receives said first drive pulse as an input, (2) is formed of the same material as that of said word lines, and (3) exhibits a signal delay charcteristic substantially equivalent to that of said word lines, and a pulse generator composed of MOS transistors which receives as an input a delayed pulse from said delay line and delivers said second drive pulse.

3. An integrated logic circuit according to claim 2, wherein said word and data lines are formed of polysilicon layers and aluminum layers respectively, and said delay line of said pulse supply means is formed of a polysilicon layer.

4. An integrated logic circuit comprising a plurality of word lines, a plurality of data lines, a plurality of memory cells coupled to said word and data lines at the intersecting points thereof, a plurality of address decoders coupled to said respective word lines and applying a first drive pulse to said memory cells coupled to said word lines, a plurality of sense amplifiers coupled to said respective data lines and detecting signals read out from said memory cells coupled to said data lines when a second drive pulse is supplied, and a pulse supply means for supplying first and second drive pulses at least to said plurality of address decoders and said sense amplifiers respectively; said pulse supply means including a delay line which (1) receives said first drive pulse as an input, (2) formed of the same material as that of said data lines, and exhibits a signal delay characteristic substantially equivalent to that of said data lines, and a pulse generator composed of MOS transistors which receives as an input a delayed pulse from said delay line and delivers said second drive pulse.

5. An integrated logic circuit according to claim 4, wherein said data and word lines are formed of semiconductor diffusion layers and aluminum layers respectively, and said delay line of said pulse supply means is formed of a semiconductor diffusion layer.

6. An integrated logic circuit according to claim 2 or 4, wherein said each memory cell includes a capacitor having one end connected to a power source and storing data and an MOS transistor having the source-drain circuit connected between the other end of said capacitor and said each data line and the gate connected to each said word line.

* * * * *